(12) United States Patent
Brofman et al.

(10) Patent No.: US 7,875,502 B2
(45) Date of Patent: Jan. 25, 2011

(54) SEMICONDUCTOR CHIPS WITH CRACK STOP REGIONS FOR REDUCING CRACK PROPAGATION FROM CHIP EDGES/CORNERS

(75) Inventors: Peter J. Brofman, Hopewell Junction, NY (US); Jon Alfred Casey, Poughkeepsie, NY (US); Ian D. Melville, Highland, NY (US); David L. Questad, Hopewell Junction, NY (US); Wolfgang Sauter, Richmond, VT (US); Thomas Anthony Wassick, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/788,521

(22) Filed: May 27, 2010

(65) Prior Publication Data
US 2010/0233872 A1    Sep. 16, 2010

Related U.S. Application Data

(62) Division of application No. 11/833,348, filed on Aug. 3, 2007, now Pat. No. 7,732,932.

(51) Int. Cl.
*H01L 21/78* (2006.01)
(52) U.S. Cl. .............................. 438/113; 257/E23.081
(58) Field of Classification Search ................ 438/113, 438/458, 462; 257/620–621, E23.081
See application file for complete search history.

(56) References Cited

U.S. PATENT DOCUMENTS

| | | | |
|---|---|---|---|
| 6,614,120 B2 | 9/2003 | Sato et al. | |
| 7,256,474 B2 | 8/2007 | Wakayama et al. | |
| 7,339,256 B2 | 3/2008 | Nakamura et al. | |
| 7,482,675 B2 | 1/2009 | Adkisson et al. | |
| 7,598,155 B1* | 10/2009 | Chen et al. | 438/462 |
| 7,615,469 B2* | 11/2009 | Grivna et al. | 438/462 |
| 7,622,364 B2* | 11/2009 | Adkisson et al. | 438/462 |
| 7,622,365 B2* | 11/2009 | Parekh | 438/462 |
| 2005/0285229 A1 | 12/2005 | Higashi et al. | |
| 2006/0012012 A1 | 1/2006 | Wang et al. | |
| 2007/0040242 A1 | 2/2007 | Sasaki et al. | |
| 2009/0032929 A1 | 2/2009 | Daubenspeck et al. | |
| 2009/0194850 A1 | 8/2009 | Kaltalioglu et al. | |

OTHER PUBLICATIONS

Notice of Allowance (Mail Date Jan. 26, 2010) for U.S. Appl. No. 11/833,348, filed Aug. 3, 2007; Confirmation No. 7730.

* cited by examiner

*Primary Examiner*—Nathan W Ha
(74) *Attorney, Agent, or Firm*—Schmeiser, Olsen & Watts; Richard M. Kotulak

(57) ABSTRACT

A chip fabrication method. A provided structure includes: a transistor on a semiconductor substrate, N interconnect layers on the semiconductor substrate and the transistor (N>0), and a first dielectric layer on the N interconnect layers. The transistor is electrically coupled to the N interconnect layers. P crack stop regions and Q crack stop regions are formed on the first dielectric layer (P, Q>0). The first dielectric layer is sandwiched between the N interconnect layers and a second dielectric layer that is formed on the first dielectric layer. Each P crack stop region is completely surrounded by the first and second dielectric layers. The second dielectric layer is sandwiched between the first dielectric layer and an underfill layer that is formed on the second dielectric layer. Each Q crack stop region is completely surrounded by the first dielectric layer and the underfill layer.

9 Claims, 8 Drawing Sheets

SEMICONDUCTOR CHIPS WITH CRACK STOP REGIONS FOR REDUCING CRACK PROPAGATION FROM CHIP EDGES/CORNERS

This application is a divisional application claiming priority to Ser. No. 11/833,348, filed Aug. 3, 2007.

FIELD OF THE INVENTION

The present invention relates to semiconductor chips, and more specifically, to the semiconductor chips having crack stop regions that reduce crack propagation from chip edges/corners.

BACKGROUND OF THE INVENTION

In a conventional semiconductor chip, cracks are likely to occur at chip edges/corners and propagate to the center of the chip. Therefore, there is a need for a structure (and method of forming the same), that reduce crack propagation from chip edges/corners to the center of the chip.

SUMMARY OF THE INVENTION

The present invention provides a semiconductor chip, comprising (a) a semiconductor substrate; (b) a transistor on the semiconductor substrate; (c) N interconnect layers on top of the semiconductor substrate and the transistor, wherein N is a positive integer, and wherein the transistor is electrically coupled to the N interconnect layers; (d) a first dielectric layer on top of the N interconnect layers; (e) P crack stop regions on top of the first dielectric layer, wherein P is a positive integer; (f) a second dielectric layer on top of the first dielectric layer, wherein the first dielectric layer is sandwiched between the second dielectric layer and the N interconnect layers, and wherein each crack stop region of the P crack stop regions is completely surrounded by the first dielectric layer and the second dielectric layer; and (g) an underfill layer on top of the second dielectric layer, wherein the second dielectric layer is sandwiched between the first dielectric layer and the underfill layer.

The present invention provides a structure (and method of forming the same), that reduce crack propagation from chip edges/corners to the center of the chip.

DETAILED DESCRIPTION OF THE INVENTION

Figure 1A:
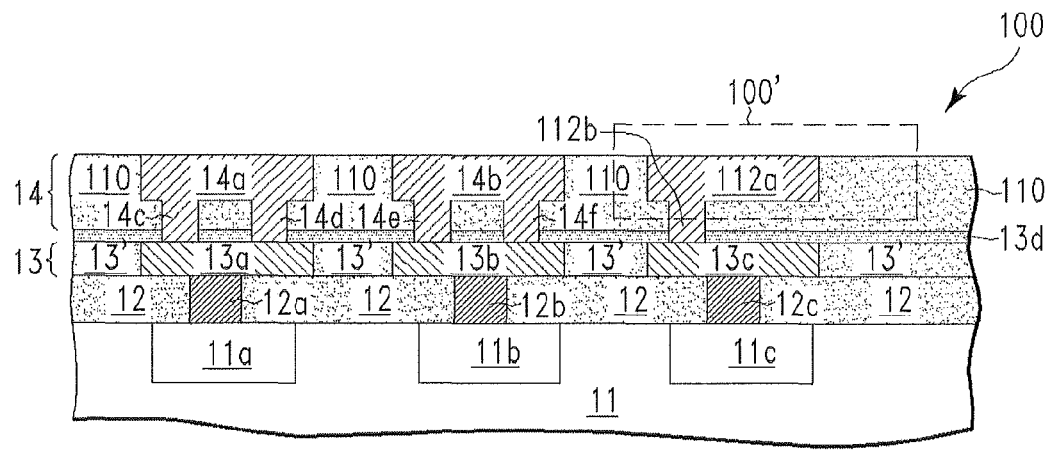
FIGS. 1A-1H (cross-section views) illustrate a fabrication process for forming a semiconductor chip, in accordance with embodiments of the present invention.

FIGS. 1A-1H (cross-section views) illustrate a fabrication process for forming a semiconductor chip 100, in accordance with embodiments of the present invention. More specifically, with reference to FIG. 1A, the fabrication process starts with the semiconductor structure 100. The semiconductor structure 100 comprises a semiconductor substrate 11 and transistors (only source/drain regions 11a, 11b, and 11c of the transistors are shown for simplicity) on the semiconductor substrate 11. The semiconductor structure 100 further comprises a BPSG (Boro-Phospho-Silicate Glass) layer 12 and contact regions 12a, 12b, and 12c in the BPSG layer 12. The contact regions 12a, 12b, and 12c can comprise tungsten and are electrically coupled to the source/drain regions 11a, 11b, and 11c, respectively.

The semiconductor structure 100 further comprises (i) an interconnect layer 13 including (a) a dielectric layer 13', and (b) metal lines 13a, 13b, and 13c in the dielectric layer 13', (ii) a nitride layer 13d on top of the interconnect layer 13, and (iii) a top interconnect layer 14 including (a) a dielectric layer 110, (b) metal lines 14a, 14b, and 112a in the dielectric layer 110, and (c) metal vias 14c, 14d, 14e, 14f, and 112b in the dielectric layer 110. The metal lines 13a, 13b, 13c, 14a, 14b, and 112a and metal vias 14c, 14d, 14e, 14f, and 112b can comprise copper (Cu). The metal lines 14a, 14b, and 112a are electrically coupled to the source/drain regions 11a, 11b, and 11c, respectively. The semiconductor structure 100 of FIG. 1A can be formed using conventional processes. For simplicity, in the figures hereafter, only a portion 100' of the structure 100 of FIG. 1A is shown. The others portions of the structure 100 of FIG. 1A go through the same fabrication processes.

Figure 1B:
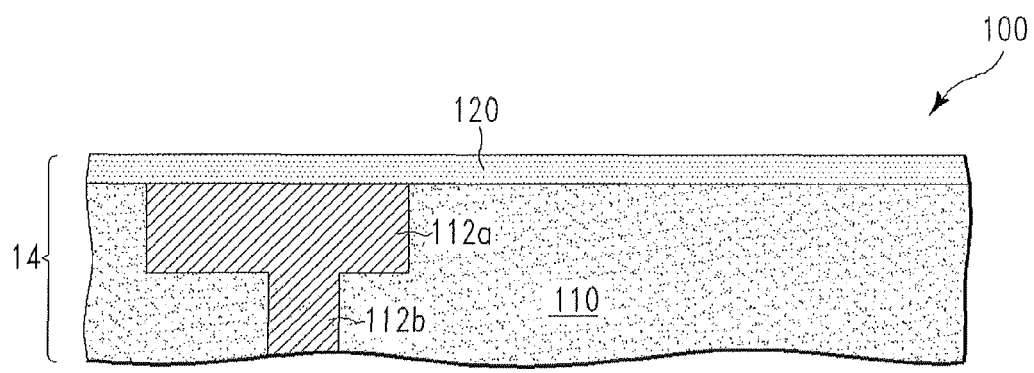

Next, with reference to FIG. 1B, in one embodiment, a dielectric layer 120 (comprising silicon nitride in one embodiment) is formed on top of the structure 100 of FIG. 1A. In one embodiment, the nitride layer 120 can be formed by CVD (Chemical Vapor Deposition) of silicon nitride on top of the interconnect layer 14.

Figure 1C:
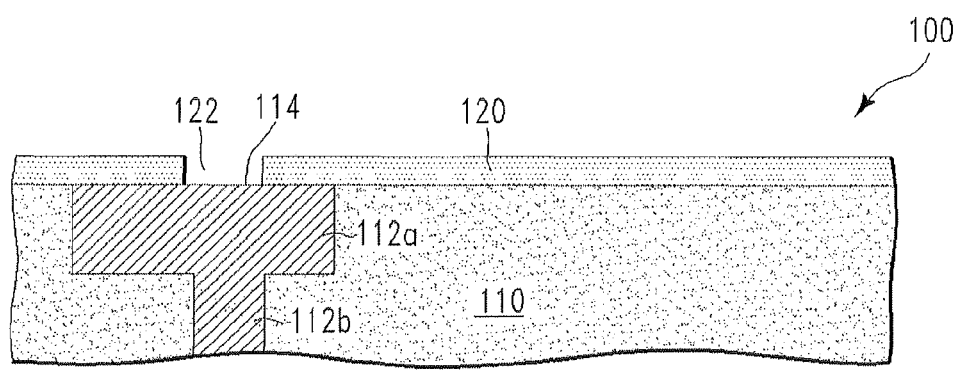

Next, with reference to FIG. 1C, in one embodiment, a hole 122 is created in the nitride layer 120 such that a top surface 114 of the Cu line 112a is exposed to the surrounding ambient through the hole 122. The hole 122 can be formed using lithographic and etching processes.

Figure 1D:
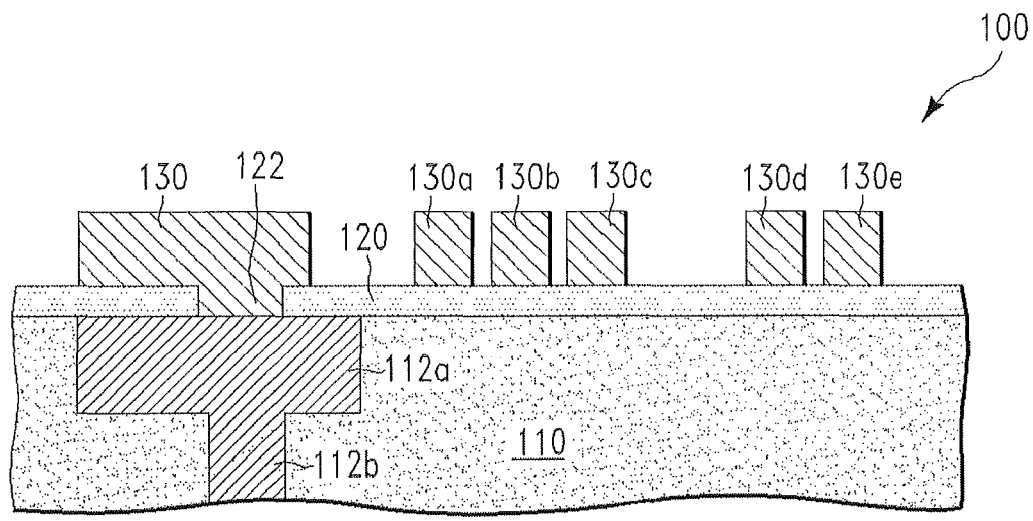

Next, with reference to FIG. 1D, in one embodiment, a pad 130 (comprising aluminum (Al) in one embodiment), and crack stop regions 130a, 130b, 130c, 130d, and 130e (comprising Al in one embodiment) are formed on top of the structure 100 of FIG. 1C such that the Al pad 130 (i) fills the hole 122, and (ii) is electrically coupled to the Cu line 112a. The Al crack stop regions 130a, 130b, 130c, 130d, and 130e are formed on top of the nitride layer 120. The Al pad 130, and the Al crack stop regions 130a, 130b, 130c, 130d, and 130e can be formed by (a) forming an Al layer (not shown) on the entire structure 100 of FIG. 1C including in the hole 122, and then (b) directionally and selectively etching back the Al layer stopping at the nitride layer 120. The directional and selective etching in step (b) may be performed using traditional lithographic and etching processes such that what remains of the Al layer after the etching are the Al pad 130, and the Al crack stop regions 130a, 130b, 130c, 130d, and 130e.

Figure 1E:
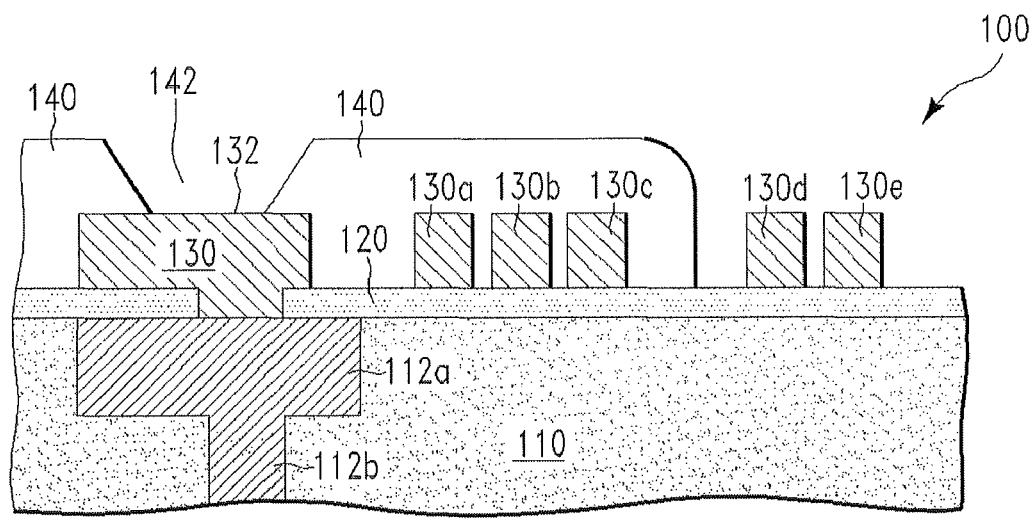

Next, with reference to FIG. 1E, in one embodiment, a photosensitive polyimide (PSPI) layer 140 is formed on top of the entire structure 100 of FIG. 1D, and then, a hole 142 is created in the PSPI layer 140 such that a top surface 132 of the Al pad 130 is exposed to the surrounding ambient via the hole 142. More specifically, the PSPI layer 140 is formed by (i) spin-applying a solvent-soluble polyimide on the entire structure 100 of FIG. 1D, and then (ii) curing the deposited solvent-soluble polyimide at a high temperature resulting in the PSPI layer 140. It should be noted that polyimide is a photosensitive polymer.

The hole 142 is formed in the PSPI layer 140 by using a conventional lithographic process. Moreover, the lithographic process is performed such that the Al crack stop regions 130d, and 130e are exposed to the surrounding ambient. It should be noted that the Al crack stop regions 130a, 130b, and 130c are completely surrounded by the nitride layer 120 and the PSPI layer 140.

Figure 1F:
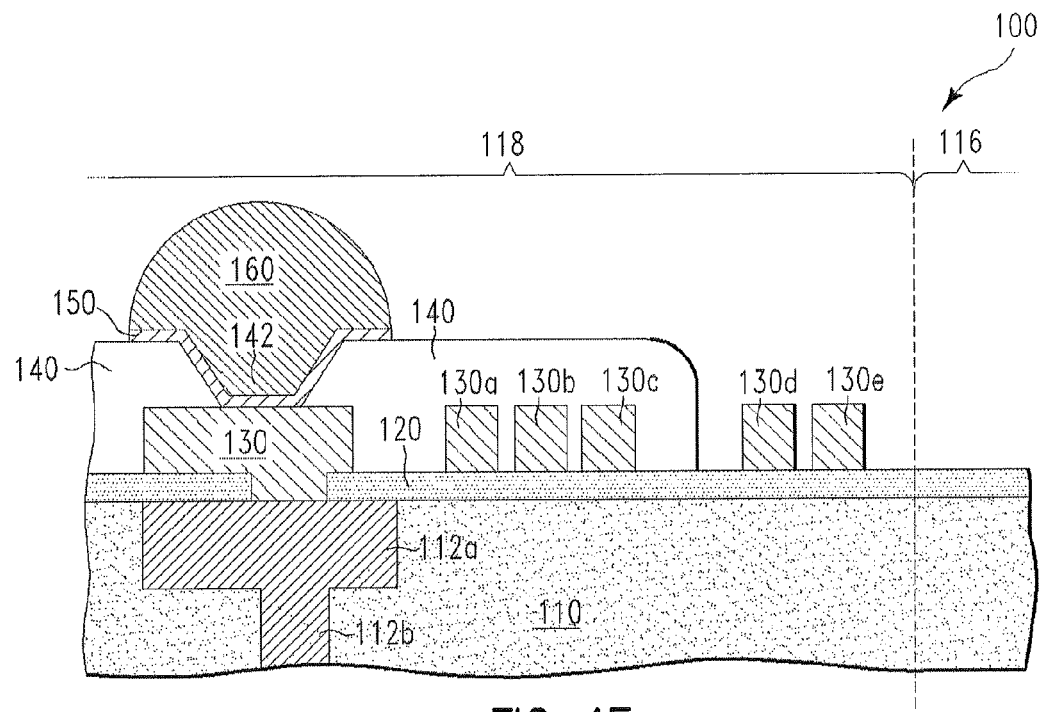
Figure 1F:
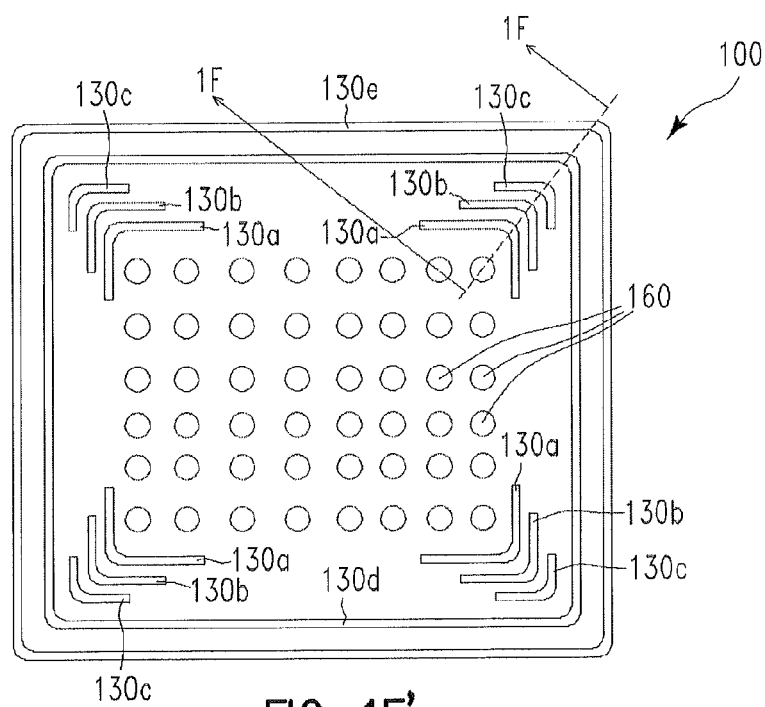
Figure 1G:
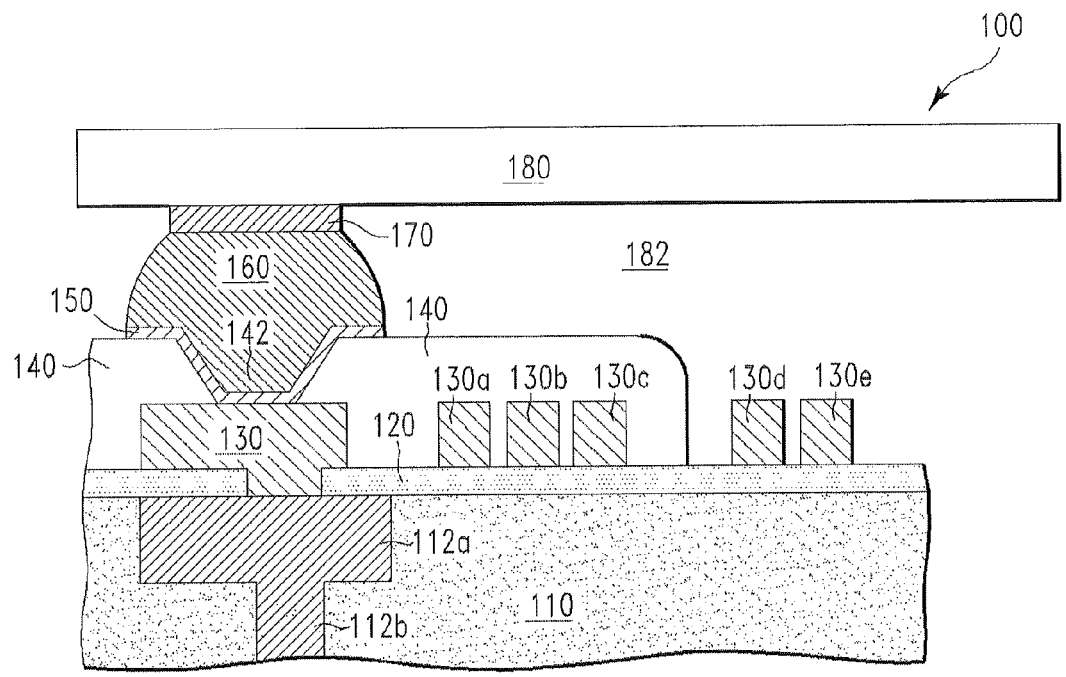

Next, with reference to FIG. 1F, in one embodiment, a bump limiting metallurgy (BLM) region 150 and a solder bump 160 are formed in the hole 142 and on top of the Al pad 130 by using a conventional method. The solder bump 160 and the BLM region 150 are electrically coupled to the source/drain region 11c of FIG. 1A through the Al pad 130, the metal line 112a, the metal via 112b, the metal line 13c, and the contact region 12c. The BLM region 150 comprises multiple layers of barrier metals, whereas the solder bump 160 can comprise a mixture of lead (Pb), silver (Ag), copper (Cu), and tin (Sn). The structure 100 comprises a chip region 118 and a dicing channel region 116, which are separated by a dashed line as shown in FIG. 1F.

Next, in one embodiment, a chip dicing process is performed wherein a blade (not shown) can be used to cut through the dicing channel region 116, resulting in the separated semiconductor chip 100 in FIG. 1F' (top-down view). It should be noted that FIG. 1F is a cross-section view of FIG. 1F' along a line 1F-1F. FIG. 1F' shows a top-down view of the semiconductor chip 100 after it is cut from the structure 100 of FIG. 1F, in accordance with embodiments of the present invention. It should be noted that only solder bumps 160 and the Al crack stop regions 130a, 130b, 130c, 130d, and 130e are shown in FIG. 1F' for simplicity. The solder bumps 160 are simultaneously formed in a manner similar to a manner of the solder bump 160 (FIG. 1F).

In one embodiment, the Al crack stop regions 130a, 130b, and 130c are at four corners of the semiconductor chip 100, whereas the Al crack stop regions 130d and 130e each form a closed loop on the perimeter the chip 100 (as shown in FIG. 1F'). In an alternative embodiment, the Al crack stop regions 130a, 130b, and 130c each form a closed loop on the perimeter the chip 100. In an alternative embodiment, all Al crack stop regions are formed as multiple separate features.

After the semiconductor chip 100 is formed using the fabrication process described above in FIGS. 1A-1F, a flip chip assembly process is performed. More specifically, with reference to FIG. 1G, in one embodiment, the chip 100 (in FIG. 1F') is flipped upside down and aligned to a laminate substrate 180. Then, the solder bumps 160 of the chip 100 are bonded directly, simultaneously, and one-to-one to pads 170 of the laminate substrate 180 at a high temperature and then cooled down. For simplicity, in FIG. 1G, the semiconductor chip 100 is not flipped upside down.

Figure 1H:
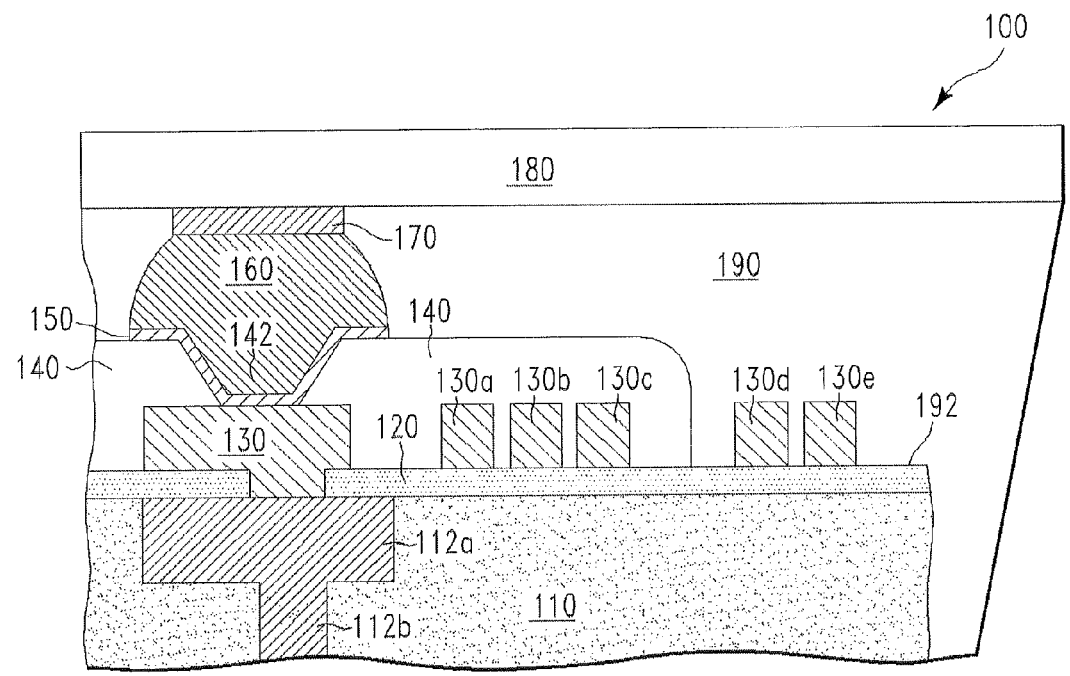

Next, in one embodiment, space 182 between the chip 100 and the laminate substrate 180 is filled with an underfill material resulting in an underfill layer 190 in FIG. 1H. The underfill material can be epoxy. It should be noted that the Al crack stop regions 130d and 130e are completely surrounded by the nitride layer 120 and the underfill layer 190.

With reference to FIG. 1H, due to the difference in the coefficients of thermal expansion (CTE) of the chip 100, the laminate substrate 180 and the underfill layer 190, cracks may occur at the fours corners and an interfacing surface 192 of the underfill layer 190 and the nitride layer 120 of the chip 100. Such cracks can propagate from the fours corners of the chip 100 through the Al crack stop regions 130e, 130d, 130c, 130b, and 130a into the center of the chip 100. The presence of the Al crack stop regions 130e, 130d, 130c, 130b, and 130a makes it more difficult for these cracks to propagate from the fours corners into the center of the chip 100.

Figure 2A:
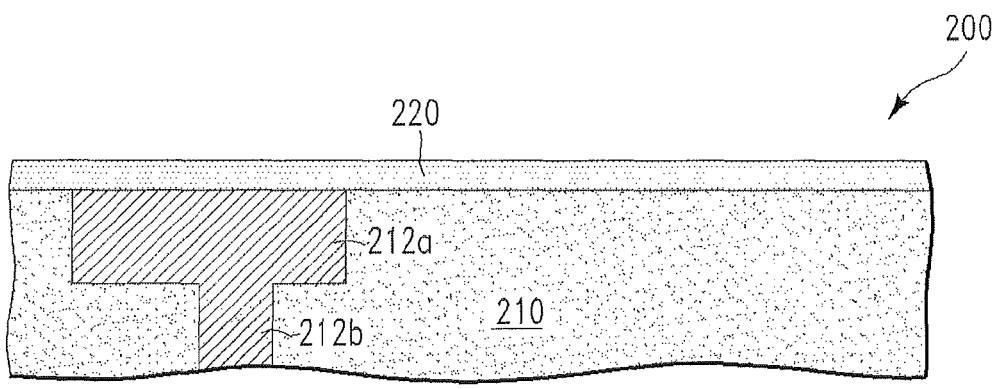
FIGS. 2A-2G (cross-section views) illustrate a fabrication process for forming a semiconductor chip, in accordance with embodiments of the present invention.

FIGS. 2A-2G (cross-section views) illustrate a fabrication process for forming a semiconductor chip 200, in accordance with embodiments of the present invention. More specifically, the fabrication process starts out with the structure 200 of FIG. 2A. In one embodiment, the structure 200 of FIG. 2A is similar to the structure 100 of FIG. 1B. It should be noted that similar regions of the structure 200 of FIG. 2A and the structure 100 of FIG. 1A have the same reference numerals, except for the first digit, which is used to indicate the figure number. For instance, a nitride layer 120 (FIG. 2A) and the nitride layer 120 (FIG. 1A) are similar.

Figure 2B:
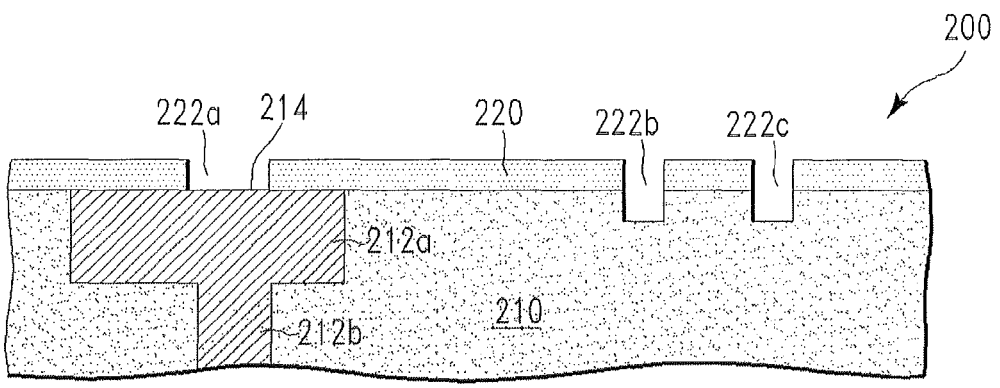

Next, with reference to FIG. 2B, in one embodiment, a hole 222a and trenches 222b and 222c are created in the nitride layer 220 such that a top surface 214 of a Cu line 212a is exposed to the surrounding ambient through the hole 222a. The hole 222a and the trenches 222b and 222c can be formed using lithographic and etching processes. Next, the trenches 222b and 222c can be dug deeper into a dielectric layer 210 by etching the dielectric layer 210 with the nitride layer 220 as a blocking mask. The trenches 222b and 222c each form a closed loop on the perimeter the chip 200. In an alternative embodiment, the trenches are formed as multiple separate features.

Figure 2C:
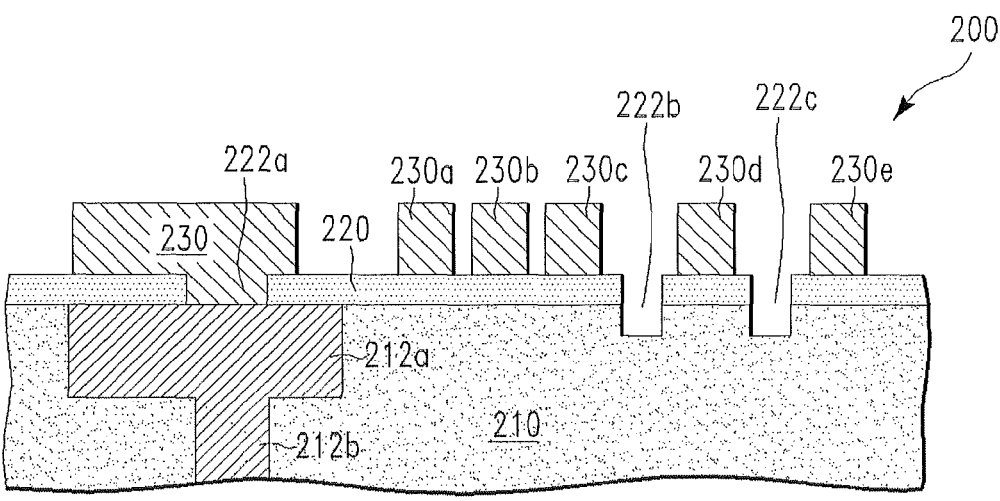

Next, with reference to FIG. 2C, in one embodiment, a pad 230, and crack stop regions 230a, 230b, 230c, 230d, and 230e are formed on top of the structure 200 of FIG. 2B such that (i) the pad 230 fills the hole 222a, (ii) the pad 230 is electrically coupled to the Cu line 212a, and (iii) the trenches 222b and 222c remain exposed to the surrounding ambient. The pad 230 and the crack stop regions 230a, 230b, 230c, 230d, and 230e can comprise Al and can be formed by using traditional lithographic and etching processes.

Figure 2D:
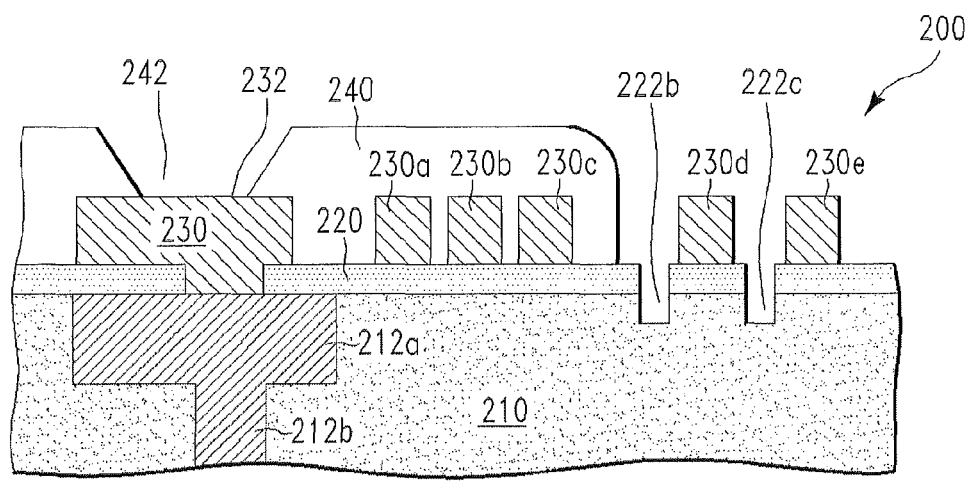

Next, with reference to FIG. 2D, in one embodiment, a PSPI layer 240 is formed on top of the structure 200 of FIG. 2C, and then, a hole 242 is created in the PSPI layer 240 such that a top surface 232 of the Al pad 230 is exposed to the surrounding ambient via the hole 242. More specifically, the PSPI layer 240 is formed by (i) spin-applying a solvent-soluble polyimide on the entire structure 200 of FIG. 2C, and then (ii) curing the deposited solvent-soluble polyimide at a high temperature resulting in the PSPI layer 240. It should be noted that polyimide is a photosensitive polymer.

The hole 242 is formed in the PSPI layer 240 by using a conventional lithographic process. Moreover, the lithographic process is performed such that the trenches 222b and 222c, and the Al crack stop regions 230d, and 230e are exposed to the surrounding ambient. It should be noted that the Al crack stop regions 230a, 230b, and 230c are completely surrounded by the nitride layer 220 and the PSPI layer 240.

Figure 2E:
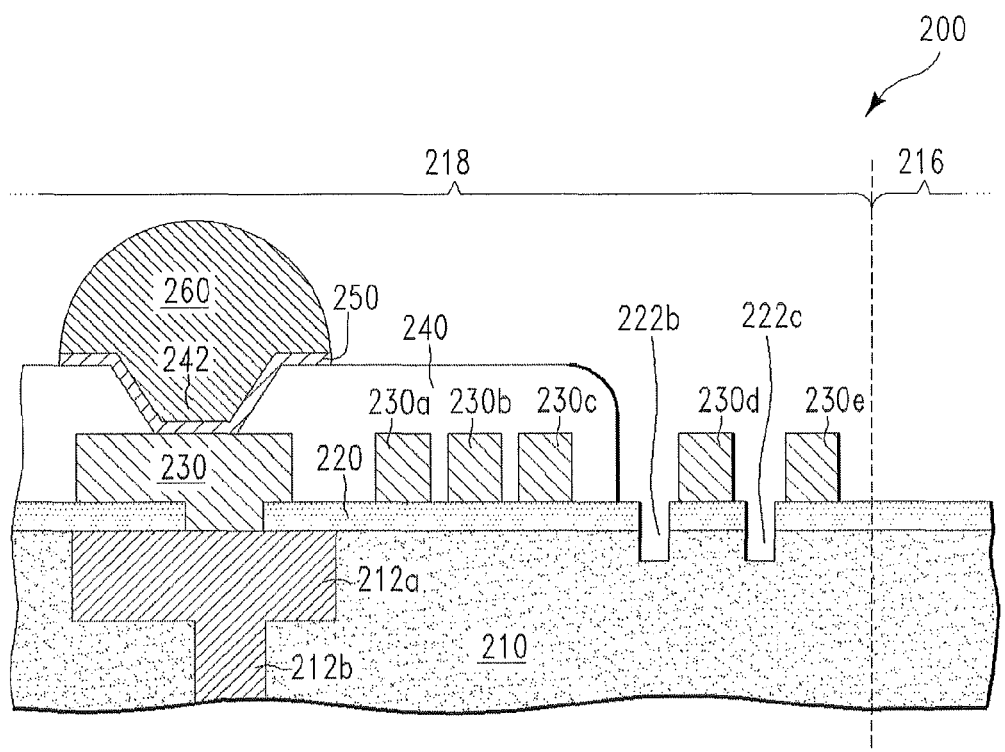
Figure 2E:
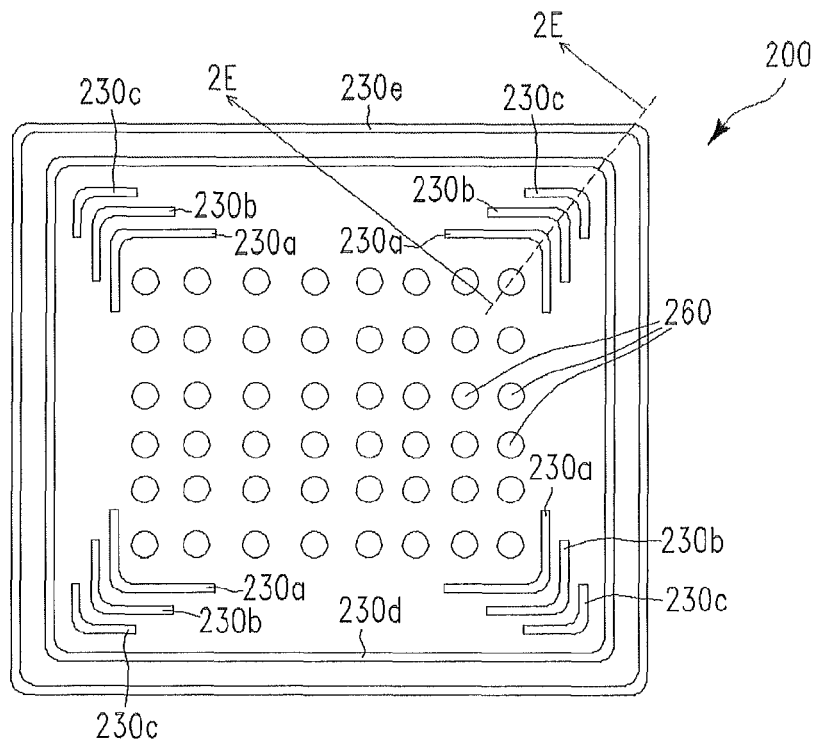
Figure 2F:
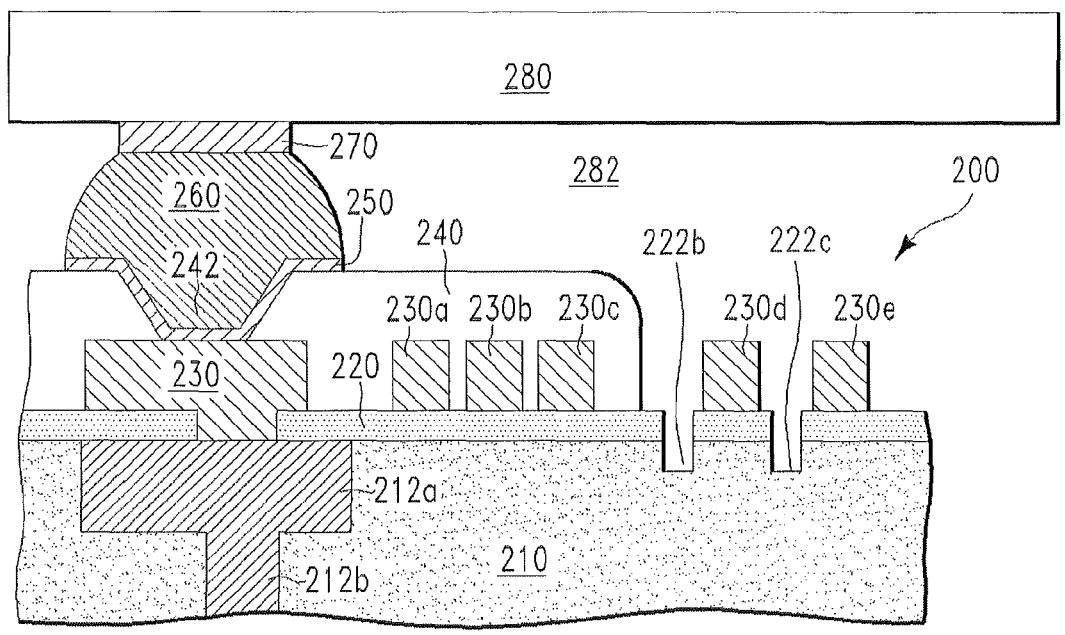

Next, with reference to FIG. 2E, in one embodiment, a BLM region 250 and a solder bump 260 are formed in the hole 242 and on top of the Al pad 230 by using a conventional method. The solder bump 260 and the BLM region 250 are electrically coupled to the Al pad 230. The BLM region 250 can comprise multiple layers of barrier metals, whereas the solder bump 260 can comprise a mixture of Pb, Ag, Cu and Sn. The structure 200 comprises a chip region 218 and a dicing channel region 216, which are separated by a dashed line as shown in FIG. 2E.

Next, in one embodiment, a chip dicing process is performed wherein a blade (not shown) can be used to cut through the dicing channel region 216, resulting in the separated semiconductor chip 200 in FIG. 2E' (top-down view). It should be noted that FIG. 2E is a cross-section view of FIG. 2E' along a line 2E-2E. FIG. 2E' shows a top-down view of the semiconductor chip 200 after it is cut from the structure 200 of FIG. 2E, in accordance with embodiments of the present invention. It should be noted that only solder bumps 260 and the Al crack stop regions 230a, 230b, 230c, 230d, and 230e are shown in FIG. 2E' for simplicity. The solder bumps 260 are simultaneously formed in a manner similar to a manner of the solder bump 260 (FIG. 2E).

In one embodiment, the Al crack stop regions 230a, 230b, and 230c are at four corners of the semiconductor chip 200, whereas the Al crack stop regions 230d and 230e each form a closed loop on the perimeter the chip 200 (as shown in FIG. 2E'). In an alternative embodiment, the Al crack stop regions 230a, 230b, and 230c each form a closed loop on the perimeter the chip 200. In an alternative embodiment, all Al crack stop regions are formed as multiple separate features.

After the semiconductor chip 200 is formed using the fabrication process described above in FIGS. 2A-2E, a flip chip process is performed. More specifically, with reference to FIG. 2F, in one embodiment, the chip 200 (in FIG. 2E') is flipped upside down and aligned to a laminate substrate 280. Then, the solder bumps 260 of the chip 200 are bonded directly, simultaneously, and one-to-one to pads 270 of the laminate substrate 280 at a high temperature and then cooled down. For simplicity, in FIG. 2F, the semiconductor chip 200 is not flipped upside down.

Figure 2G:
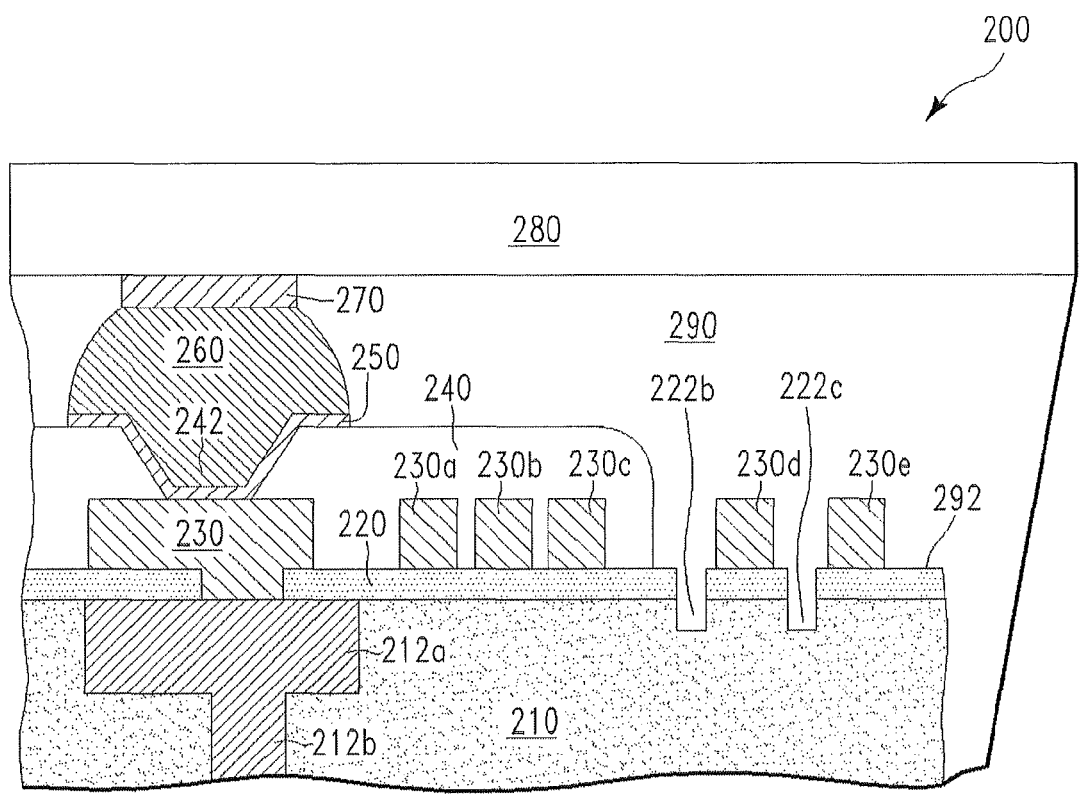

Next, in one embodiment, space 282 between the chip 200 and a laminate substrate 280 is filled with an underfill material resulting in an underfill layer 290 in FIG. 2G. It should be noted that the trenches 222b and 222c are also filled with the underfill material. The underfill material can be epoxy. It should be noted that the Al crack stop regions 230d and 230e are completely surrounded by the nitride layer 220 and the underfill layer 290.

With reference to FIG. 2G, due to the difference in the CTE of the chip 200, the laminate substrate 280 and the laminate substrate 280, cracks may occur at the fours corners and an interfacing surface 292 of the underfill layer 290 and the nitride layer 220 of the chip 200. Such cracks can propagate from the fours corners of the chip 200 through the Al crack stop regions 230e, 230d, 230c, 230b, and 230a into the center of the chip 200. The presence of the Al crack stop regions 230e, 230d, 230c, 230b, and 230a and the filled trenches 222b and 222c makes it more difficult for these cracks to propagate from the fours corners into the center of the chip 200.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A chip fabrication method, comprising:
   providing a structure which includes:
   (a) a semiconductor substrate,
   (b) a transistor on the semiconductor substrate,
   (c) N interconnect layers on top of the semiconductor substrate and the transistor, wherein N is a positive integer, and wherein the transistor is electrically coupled to the N interconnect layers, and
   (d) a first dielectric layer on top of the N interconnect layers;
   forming P crack stop regions and Q crack stop regions on top of the first dielectric layer, wherein P and Q are positive integers;
   forming a second dielectric layer on top of the first dielectric layer, wherein the first dielectric layer is sandwiched between the second dielectric layer and the N interconnect layers, and wherein each crack stop region of the P crack stop regions is completely surrounded by the first dielectric layer and the second dielectric layer; and
   forming an underfill layer on top of the second dielectric layer, wherein the second dielectric layer is sandwiched between the first dielectric layer and the underfill layer, and wherein each crack stop region of the Q crack stop regions is completely surrounded by the first dielectric layer and the underfill layer.

2. The method of claim 1, wherein each crack stop region of the P crack stop regions resides at a corner of the semiconductor chip.

3. The method of claim 1, wherein each crack stop region of the Q crack stop regions forms a closed loop on a perimeter of the semiconductor chip.

4. The method of claim 1, wherein the P crack stop regions and the Q crack stop regions comprise Al.

5. A chip fabrication method, comprising:
   providing a structure which includes:
   (a) a semiconductor substrate,
   (b) a transistor on the semiconductor substrate,
   (c) N interconnect layers on top of the semiconductor substrate and the transistor, wherein N is a positive integer, wherein the transistor is electrically coupled to the N interconnect layers, and wherein the N interconnect layers comprise a top interconnect layer, and
   (d) a first dielectric layer on top of the N interconnect layers;
   forming L trenches in the top interconnect layer of the N interconnect layers and the first dielectric layer, wherein L is a positive integer;
   forming P crack stop regions and Q crack stop regions on top of the first dielectric layer, wherein P and Q are positive integers;
   forming a second dielectric layer on top of the first dielectric layer, wherein the first dielectric layer is sandwiched between the second dielectric layer and the N interconnect layers, and wherein each crack stop region of the P crack stop regions is completely surrounded by the first dielectric layer and the second dielectric layer; and
   forming an underfill layer on top of the second dielectric layer, wherein portions of the underfill layer completely fill the L trenches, wherein the second dielectric layer is sandwiched between the first dielectric layer and the underfill layer, and wherein each crack stop region of the Q crack stop regions is completely surrounded by the first dielectric layer and the underfill layer.

6. The method of claim 5, wherein each crack stop region of the P crack stop regions resides at a corner of the semiconductor chip.

7. The method of claim 5, wherein each crack stop region of the Q crack stop regions forms a closed loop on a perimeter of the semiconductor chip.

8. The method of claim 5, wherein the P crack stop regions and the Q crack stop regions comprise Al.

9. The method of claim 5, wherein each trench of the L trenches forms a closed loop on a perimeter of the semiconductor chip.

* * * * *